United States Patent
Kashyap et al.

(10) Patent No.: US 10,186,509 B2
(45) Date of Patent: Jan. 22, 2019

(54) METHOD AND SYSTEM FOR A SEMICONDUCTOR DEVICE WITH INTEGRATED TRANSIENT VOLTAGE SUPPRESSION

(71) Applicant: General Electric Company, Schenectady, NY (US)

(72) Inventors: Avinash Srikrishnan Kashyap, Clifton Park, NY (US); Peter Micah Sandvik, Niskayuna, NY (US); James Jay McMahon, Clifton Park, NY (US); Ljubisa Dragoljub Stevanovic, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/333,868

(22) Filed: Oct. 25, 2016

(65) Prior Publication Data

US 2017/0294434 A1 Oct. 12, 2017

Related U.S. Application Data

(62) Division of application No. 13/957,115, filed on Aug. 1, 2013, now Pat. No. 9,508,841.

(51) Int. Cl.
*H01L 29/06* (2006.01)
*H01L 29/16* (2006.01)
(Continued)

(52) U.S. Cl.
CPC ...... *H01L 27/0617* (2013.01); *H01L 27/0248* (2013.01); *H01L 27/0251* (2013.01);
(Continued)

(58) Field of Classification Search
CPC ............ H01L 27/0248; H01L 27/0255; H01L 27/1027; H01L 27/3246; H01L 29/74;
(Continued)

(56) References Cited

U.S. PATENT DOCUMENTS

| 4,342,956 | A | * | 8/1982 | Archer | ................. | H03K 17/601 |
| | | | | | | 323/289 |
| 4,698,655 | A | * | 10/1987 | Schultz | ............... | H01L 27/0259 |
| | | | | | | 257/108 |

(Continued)

OTHER PUBLICATIONS

"Transient Overvoltage Protection", Publication Order No. TND335/D, by Semiconductor Components Industries LLC, "ON semiconductor", Apr. 2008, Rev.0.*

(Continued)

*Primary Examiner* — Caleb Henry
(74) *Attorney, Agent, or Firm* — GE Global Patent Operation; Nitin Joshi

(57) ABSTRACT

A power transistor assembly and method of operating the assembly are provided. The power transistor assembly includes integrated transient voltage suppression on a single semiconductor substrate and includes a transistor formed of a wide band gap material, the transistor including a gate terminal, a source terminal, and a drain terminal, the transistor further including a predetermined maximum allowable gate voltage value, and a transient voltage suppression (TVS) device formed of a wide band gap material, the TVS device formed with the transistor as a single semiconductor device, the TVS device electrically coupled to the transistor between at least one of the gate and source terminals and the drain and source terminals, the TVS device including a breakdown voltage limitation selected to be greater than the predetermined maximum allowable gate voltage value.

11 Claims, 5 Drawing Sheets

(51) Int. Cl.
    *H01L 29/74*     (2006.01)
    *H01L 29/78*     (2006.01)
    *H01L 27/02*     (2006.01)
    *H01L 27/06*     (2006.01)
    *H01L 29/861*     (2006.01)
    *H01L 29/739*     (2006.01)

(52) U.S. Cl.
    CPC ...... *H01L 27/0255* (2013.01); *H01L 29/1608* (2013.01); *H01L 29/7424* (2013.01); *H01L 29/7811* (2013.01); *H01L 29/7395* (2013.01); *H01L 29/74* (2013.01); *H01L 29/7802* (2013.01); *H01L 29/861* (2013.01)

(58) Field of Classification Search
    CPC ............ H01L 29/7424; H01L 29/7808; H01L 29/866; H01L 29/0619; H01L 29/7811; H01L 29/1608; H01L 51/525; H01L 27/0617
    USPC ............ 257/72, 77, 107, 173, 174, E29.211
    See application file for complete search history.

(56) References Cited

U.S. PATENT DOCUMENTS

| | | | |
|---|---|---|---|
| 5,243,205 A | 9/1993 | Kitagawa et al. | |
| 5,475,258 A | 12/1995 | Kato et al. | |
| 5,731,729 A | 3/1998 | Ochi | |
| 6,043,701 A | 3/2000 | Schrittesser | |
| 6,198,136 B1 | 3/2001 | Voldman et al. | |
| 6,423,987 B1 * | 7/2002 | Constapel | H01L 29/7436 257/107 |
| 6,633,063 B2 | 10/2003 | Robb et al. | |
| 6,855,981 B2 | 2/2005 | Kumar et al. | |
| 6,861,723 B2 | 3/2005 | Willmeroth | |
| 6,867,436 B1 | 3/2005 | Matteson et al. | |
| 7,656,003 B2 | 2/2010 | Davies | |
| 7,932,133 B2 * | 4/2011 | Cogan | H01L 29/866 257/E21.35 |
| 8,530,902 B2 | 9/2013 | Kashyap et al. | |
| 9,508,841 B2 * | 11/2016 | Kashyap | H01L 29/1608 |
| 2001/0019496 A1 | 9/2001 | Wang | |
| 2001/0025961 A1 * | 10/2001 | Nakamura | H01L 29/7393 257/107 |
| 2006/0214221 A1 * | 9/2006 | Challa | H01L 21/3065 257/328 |
| 2007/0252168 A1 * | 11/2007 | Shimoida | H01L 27/0255 257/147 |
| 2008/0012044 A1 * | 1/2008 | Salcedo | H01L 27/0262 257/173 |
| 2010/0237356 A1 | 9/2010 | Haney et al. | |
| 2011/0127577 A1 | 6/2011 | Bobde | |
| 2011/0254010 A1 | 10/2011 | Zhang | |
| 2013/0286517 A1 * | 10/2013 | Tian | H02H 3/20 361/56 |
| 2015/0034969 A1 * | 2/2015 | Kashyap | H01L 29/1608 257/77 |
| 2017/0294434 A1 * | 10/2017 | Kashyap | H01L 29/1608 |

OTHER PUBLICATIONS

Wolf, "Silicon Processing in the VLSI Era", The Submicron MOSFET, Lattice Press, Sunset Beach, CA (USA), vol. No. 03, sub section: 3.1.1, pp. 85, ISBN: 0-961672-5-3, 1995.

Wolf et al., "Silicon Processing for the VLSI Era", Processing Technology, sub section:7.7.1, vol. No. 01, pp. 227, IBSN: 0-9616721-6-1, 2000.

Vassilevski et al., "Low Voltage Silicon Carbide Zener Diode", Materials Science Forum, vol. No. 457-460, pp. 1029-1032, Jun. 2004.

"Transient Overvoltage Protection", Semiconductor Components Industries, LLC, ON Semiconductor, Publication Order No. TND335/D, Apr. 2008.

* cited by examiner

METHOD AND SYSTEM FOR A SEMICONDUCTOR DEVICE WITH INTEGRATED TRANSIENT VOLTAGE SUPPRESSION

BACKGROUND OF THE DISCLOSURE

This description relates to power semiconductor devices, and, more particularly, to power transistors and thyristors that include monolithically integrated or discrete transient voltage suppression.

Power semiconductor devices, including transistor and thyristors, are used in many power electronic systems. Some semiconductor devices, such as field effect transistors (FET) have a thin oxide layer at the gate which acts as a dielectric. When the terminals are exposed to transient overvoltages (due to EMI, voltage spikes, static discharge etc.), even for a very short duration, the one or more semiconductor layers in the device can rupture, potentially destroying the device. Similarly, devices such as thyristors, require a gate electrode for current injection, to facilitate latching. When this terminal is exposed to very large current levels, even for short durations, the device may suffer degradation which may include failure.

To protect these devices, bidirectional diodes are often coupled between the terminals. However, the diodes take up space on circuit boards or enclosures housing the semiconductor devices. Moreover, electrically coupling the devices together using wires or traces tends to increase the reactance of the connection and may slow the response of the transient voltage suppressor.

BRIEF DESCRIPTION OF THE DISCLOSURE

In one embodiment, a power semiconductor assembly with integrated transient voltage suppression on a single semiconductor substrate includes a semiconductor device formed of a wide band gap material, the semiconductor device including a first electrical terminal, a second electrical terminal, and a third electrical terminal, the transistor further including a predetermined maximum allowable first electrical terminal voltage value, and a transient voltage suppression (TVS) device formed of a wide band gap material, the TVS device formed with the semiconductor device as a single semiconductor device, the TVS device electrically coupled to the semiconductor device between two of the three terminals, the TVS device including a turn-on voltage selected to be less than the predetermined maximum electrical terminal voltage value.

In another embodiment, a transient voltage protected transistor system includes a field effect transistor (FET) including a silicon carbide semiconductor substrate formed of a first conductivity type material, an epitaxial drift layer formed of a silicon carbide semiconductor material that is relatively lightly doped with respect to the substrate, and a transient voltage suppression (TVS) device formed of silicon carbide semiconductor material, the TVS electrically coupled to the transistor between at least one of the gate and source terminals and the drain and source terminals, the TVS device formed using ion implantation proximate the transistor.

In yet another embodiment, a method of operating a transistor system having integrated transient voltage suppression where the transistor system includes a transistor formed of a wide band gap semiconductor material and a transient voltage suppression (TVS) device formed of the wide band gap semiconductor material using ion implantation proximate the transistor and wherein the method includes at least one of operating the transistor at a temperature greater than 150° Celsius and operating the transistor at a voltage greater than 600 Volts.

In yet another embodiment, a thyristor device with integrated transient voltage suppression on a single semiconductor substrate includes a thyristor formed of a wide band gap material, the thyristor including a gate terminal, an anode terminal, and a cathode terminal, a lower base terminal, the thyristor further including a predetermined maximum allowable gate voltage value, and a transient voltage suppression (TVS) device formed of a wide band gap material, the TVS device formed with the thyristor as a single semiconductor device, the TVS device electrically coupled to the thyristor between the gate terminals and terminal connecting to a safe path for excess energy, e.g. ground, the TVS device including a turn-on voltage selected to be less than the predetermined maximum electrical terminal voltage value.

In yet another embodiment, a transient voltage protected thyristor system includes a thyristor device including a silicon carbide semiconductor substrate formed of a first conductivity type material, a epitaxially grown lower base layer formed of a silicon carbide semiconductor material that is relatively lightly doped and of opposite polarity with respect to the substrate, an epitaxially grown upper base layer of opposite polarity to the lower base layer and moderately doped, a transient voltage suppression (TVS) device formed of silicon carbide semiconductor material in the upper base layer, the TVS electrically coupled to the transistor between at the gate and external terminals, the TVS device formed using ion implantation proximate the transistor, and an epitaxially grown contact layer, with opposite doping to the upper base layer, and relatively highly doped.

In yet another embodiment, a method of operating a thyristor system having integrated transient voltage suppression where the thyristor system includes a thyristor formed of a wide band gap semiconductor material and a transient voltage suppression (TVS) device formed of the wide band gap semiconductor material using ion implantation proximate the transistor and wherein the method includes at least one of operating the thyristor at a temperature greater than 150° Celsius and operating the transistor at a voltage greater than 600 Volts.

BRIEF DESCRIPTION OF THE DRAWINGS

FIG. 1 is a schematic diagram of a power transistor assembly with integrated transient voltage suppression in accordance with an example embodiment of the present disclosure.

FIG. 2 is a schematic diagram of power transistor assembly in accordance with another example embodiment of the present disclosure.

FIG. 3 is a cross-sectional view of a power transistor assembly in accordance with an example embodiment of the present disclosure.

FIG. 4 is a cross-sectional view of a power transistor assembly in accordance with another example embodiment of the present disclosure.

FIG. 5 is a cross-sectional view of a power transistor assembly in accordance with another example embodiment of the present disclosure.

FIG. 6 is a flow diagram of a method of operating a transistor system in accordance with an example embodiment of the present disclosure.

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

The following detailed description illustrates embodiments of the invention by way of example and not by way of limitation. It is contemplated that embodiments the disclosure have general application to semiconductor fabrication for industrial, commercial, and residential applications.

This disclosure describes a transient voltage suppressor (TVS) device connected between terminals of a power transistor and a thyristors to shunt any overvoltages that these devices might be subjected to. The TVS device may either be monolithically integrated through a suitable fabrication process or co-packed with the devices in a power device package.

Embodiments of the present disclosure include a TVS with a breakdown voltage selected to be slightly higher than the maximum allowable transistor terminal voltage is connected between the transistor terminals, or a suitable overvoltage designed for the gate terminal of the thyristor. When the terminal voltages are within the operating range of the MOSFET or thyristor, the TVS device is off. When there is a transient overvoltage occurring at the terminals, the TVS device is turned on and offers a very low resistance path for the current to flow, thereby protecting the device.

The integrated TVS device protects the transistor and thyristor, or power devices, from degradation or failure due to overvoltage, EMI, static discharge etc. This improves the reliability of the device while not adding an additional component to the circuit, which increases the board area. Because the power device and TVS is formed of a wide band gap material, for example, silicon carbide (SiC), it can be used at temperatures greater than 175° Celsius, for example, 600° Celsius, which is not possible with silicon semiconductor devices. The TVS devices are also much smaller in size compared to silicon components and therefore do not have a high capacitance, which can reduce the switching speed of the transistor. Given the rigid clamping properties of for example, MOSFET transistor and thyristor devices, they can be protected for a larger range of overvoltages.

Figure 1:
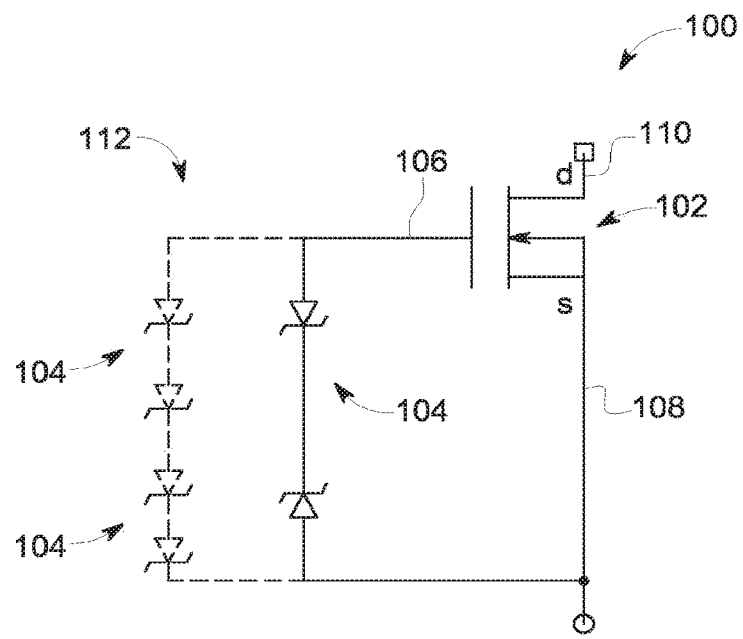
FIGS. 1-6 show example embodiments of the method and system described herein.

FIG. 1 is a schematic diagram of a power transistor assembly 100 with integrated transient voltage suppression in accordance with an example embodiment of the present disclosure. In the example embodiment, power transistor assembly 100 includes a power transistor 102, for example, but not limited to, a field effect transistor (FET) and a TVS device 104. In the example embodiment, TVS device 104 is electrically coupled between a gate terminal 106 and a source terminal 108 of transistor 102. In various embodiments, TVS device 104 may be coupled between any of gate terminal 106, source terminal 108, and a drain terminal 110 of transistor 102. In other embodiments, TVS device 104 may be embodied in a TVS assembly 112 include a plurality of bidirectional TVS devices 104. In various embodiments, TVS devices 104 of TVS assembly 112 may be electrically coupled in series, parallel, or combinations thereof. Coupling TVS device 104 in series, parallel, or series parallel permits increasing the voltage and current carrying capability of TVS assembly 112, such that the capabilities can be selected to suit a particular purpose.

Transistor 102 and/or TVS device 104 may be formed of silicon carbide or other wide band gap semiconductor. Moreover, transistor 102 and/or TVS device 104 may be formed monolithically on the same semiconductor substrate material during a single die fabrication process. In various other embodiments, transistor 102 and/or TVS device 104 may be formed on separate semiconductor substrates and electrically coupled together in a single electronic package.

Figure 2:
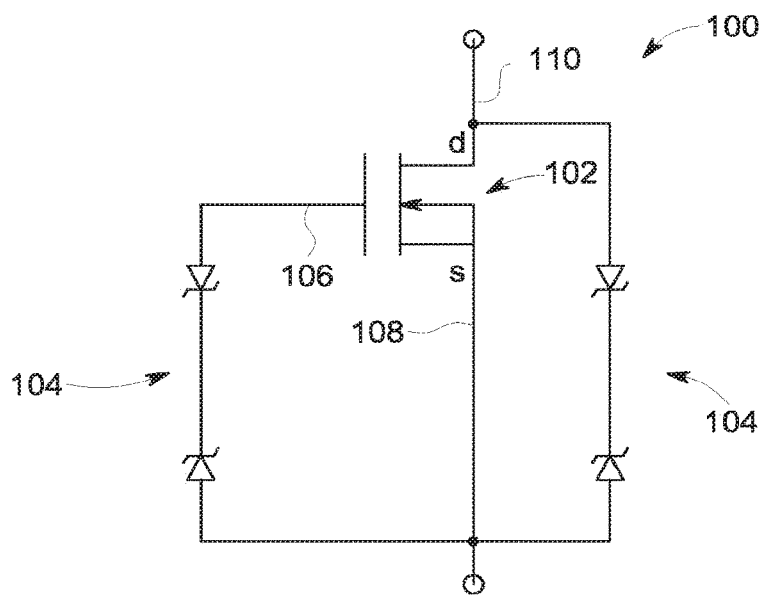

FIG. 2 is a schematic diagram of power transistor assembly 100 in accordance with another example embodiment of the present disclosure. In this embodiment, power transistor assembly 100 includes a TVS device 104 electrically coupled across drain terminal 110 and source terminal 108, in addition to the TVS device 104 electrically coupled between gate terminal 106 and source terminal 108.

Figure 3:
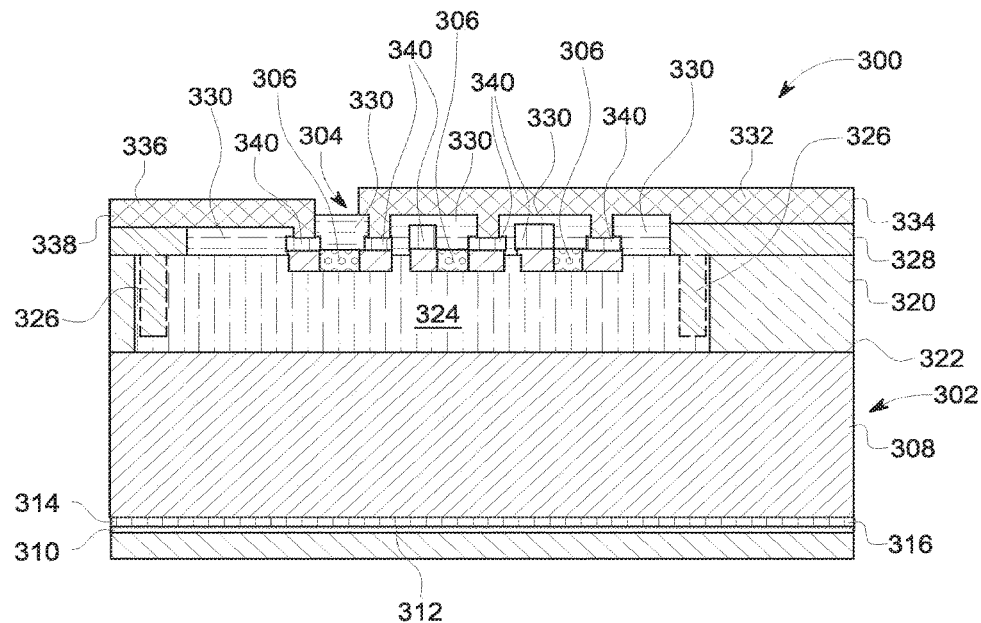

FIG. 3 is a cross-sectional view of a power transistor assembly 300 in accordance with an example embodiment of the present disclosure. In the example embodiment, power transistor assembly 100 includes a power transistor 302 and a TVS assembly 304 comprising three TVS devices 306 coupled in electrical parallel and formed in a laterally extending configuration across transistor 302.

Power transistor assembly 300 includes a substrate 308 formed of a wide band gap material of a first polarity, for example, but not limited to, silicon carbide (SiC). A layer 310 of nickel metal is applied to a first face 312 of substrate 308. During a treatment process, a portion 314 of layer 310 combines with substrate 308 to form a layer 316 of, for example, but not limited to, nickel silicide (NiSi). The NiSi permits layer 310 to adhere to substrate 308 and provide an electrical contact to substrate 308. A metallic layer 318, for example, but not limited to, gold (Au) is bonded or otherwise coupled to layer 310 for connection to components offboard power transistor assembly 300.

A drift layer 320 of wide band gap material of a second polarity is epitaxially grown on an opposite face 322 of substrate 308. Layer 320 is relatively lightly doped with respect to substrate 308. For example, substrate 308 includes a concentration of dopant three orders of magnitude greater than the concentration of dopant in layer 320. In other embodiments, the concentration of dopant in substrate 308 may be more or less than three orders of magnitude greater than the concentration of dopant in layer 320. To form TVS assembly 304, a portion 324 of layer 320 is ion implanted to neutralize drift layer 320 in portion 324. Ions of, for example, but not limited to, hydrogen or oxygen are used to neutralize portion 324 by implantation. In one embodiment, trenches 326 are etched or cut into portion 324 and filled with a dielectric material to increase isolation of drift region 320. Using trench isolation may provide additional isolation, which could permit making power transistor assembly 300 smaller and/or allowing a greater number of power transistor assembly 300 to be packed closer together on a die or in a package. In various embodiments, trenches 326 are not used.

In the example embodiment, TVS devices 306 are also formed by ion implantation of portion 324. TVS devices 306 may be formed of N+, P−, N+ semiconductor material wherein the respective dopants are ion implanted into portion 324. In some embodiments, TVS devices 306 operate using punch through physics. In various embodiments, TVS devices 306 may be formed of a three-layer structure, a four-layer structure, five-layer structure, or may have a different number of layers. TVS devices 306 may also operate using avalanche physics. Moreover, TVS devices 306 may be connected in series or parallel, or series parallel to improve the current carrying or voltage handling capability of the TVS devices 306.

A field dielectric layer 328 provides contact isolation for power transistor assembly 300 and an interlayer dielectric layer 330 permits isolating the various terminals of TVS devices 306 for electrically connecting the TVS devices 306 together and to the external gate and source terminals of power transistor assembly 300. A first metal layer 332 permits connection of source terminal 334 to power transistor assembly 300 and a second layer 336 permits connection of a gate terminal 338. A bonding layer 340 facilitates connecting metal layers 332 and 336 to the terminals of TVS devices 306.

Forming power transistor assembly 300 of SiC or other wide band gap semiconductor material permits operation of power transistor assembly 300 a temperature greater than 150° Celsius and/or at a voltage greater than 600 Volts.

Figure 4:
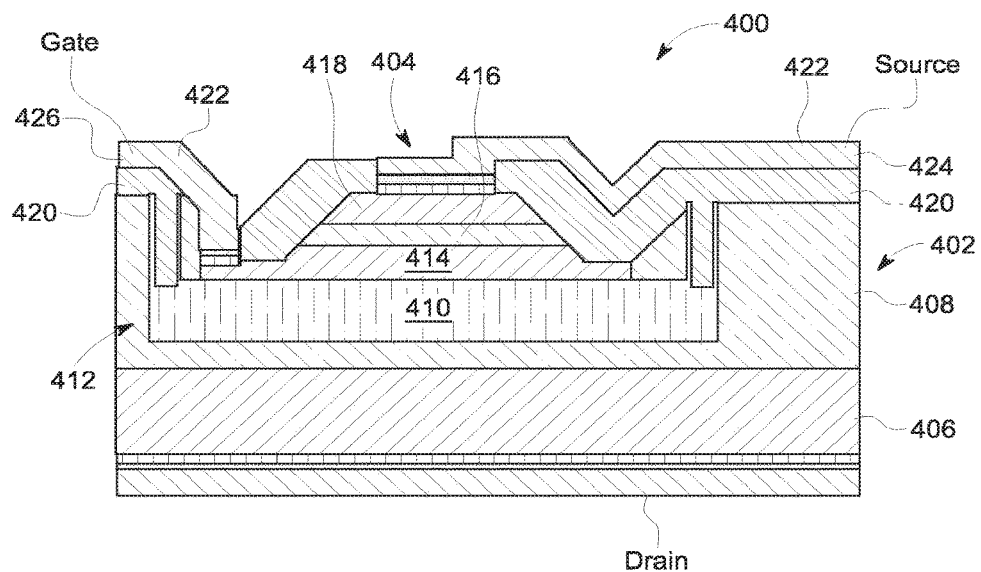

FIG. 4 is a cross-sectional view of a power transistor assembly 400 in accordance with another example embodiment of the present disclosure. In the example embodiment, power transistor assembly 400 includes a power transistor 402 with a vertically oriented TVS device 404. Power transistor assembly 400 includes a substrate layer 406 and a relatively lightly doped drift layer 408. An isolation layer 410 is ion implanted into a portion 412 of drift layer 408. An N+ layer 414, a P− layer 416, and an N+ layer 418 are formed by ion implantation. A dielectric layer 420 provides electrical isolation for power transistor 402 and TVS device 404. Electrical contacts to TVS device 404 are formed of a nickel layer that combines with the SiC to form a silicide layer against the N+ layers 414 and 418 of TVS device 404. An electrical trace layer 422 provides an electrical path to a source terminal 424 and a gate terminal 426.

Figure 5:
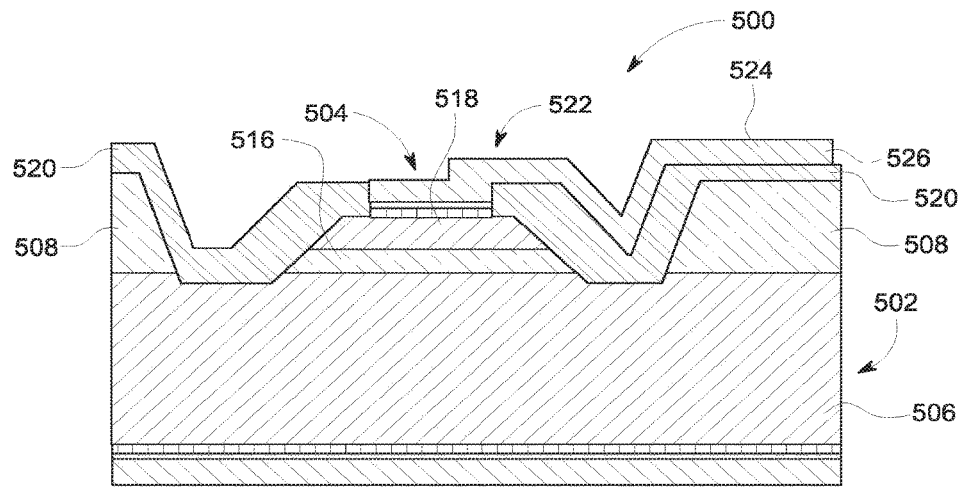

FIG. 5 is a cross-sectional view of a power transistor assembly 500 in accordance with another example embodiment of the present disclosure. In the example embodiment, power transistor assembly 500 includes a power transistor 502 with a vertically oriented TVS device 504. Power transistor assembly 500 includes a substrate layer 506 and a relatively lightly doped drift layer 508. In contrast to power transistor assembly 400 (shown in FIG. 4), power transistor assembly 500 has no isolation layer and substrate 506 forms a first N+ layer of TVS device 504. A P− layer 516, and an N+ layer 518 are formed by ion implantation over a portion of substrate 506. Layers 516 and 518 of TVS device 504 are formed in a mesa configuration and a dielectric layer 520 covers drift layer 508 and TVS device 504 except for a contact area 522. Dielectric layer 520 provides electrical isolation for power transistor 502 and TVS device 504. Electrical contacts to TVS device 504 are formed of a nickel layer that combines with the SiC to form a silicide layer against the N+ layer 518 of TVS device 504. An electrical trace layer 524 provides an electrical path to a source terminal 526.

Figure 6:
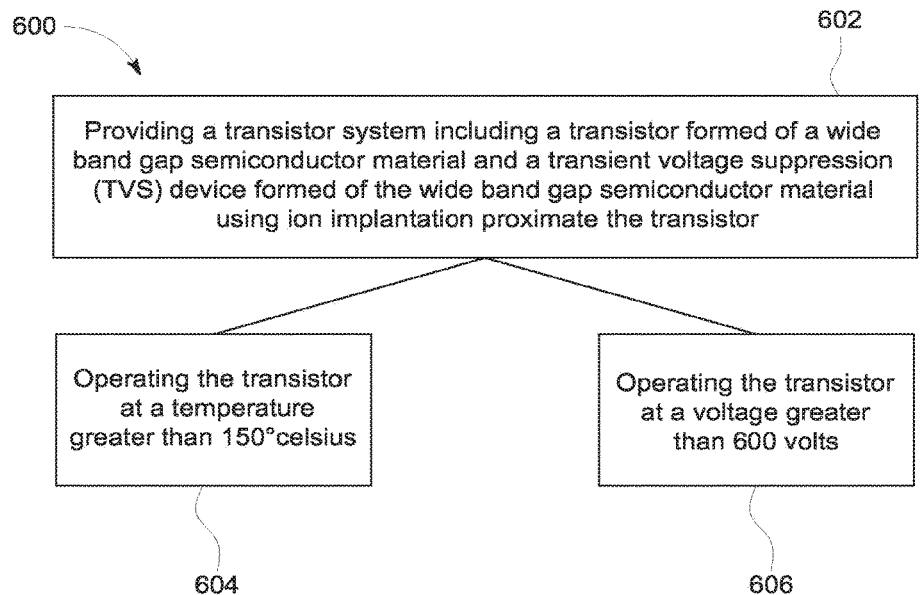

FIG. 6 is a flow diagram of a method 600 of operating a transistor system in accordance with an example embodiment of the present disclosure. In the example embodiment, method 600 includes providing 602 a transistor system including a transistor formed of a wide band gap semiconductor material and a transient voltage suppression (TVS) device formed of the wide band gap semiconductor material using ion implantation proximate the transistor, operating 604 the transistor at a temperature greater than 150° Celsius, or operating 606 the transistor at a voltage greater than 600 Volts.

Figure 7:
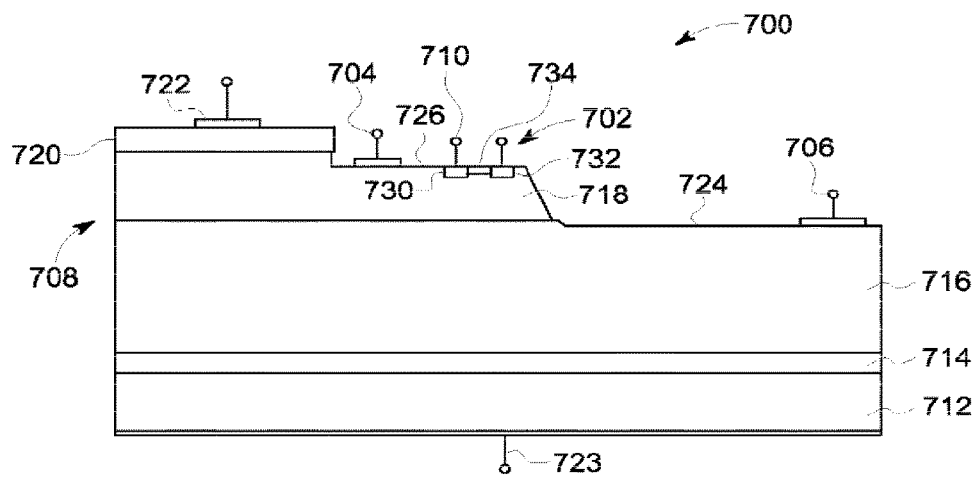
FIG. 7 is a diagram of the cross section of a thyristor assembly with a monolithically integrated transient voltage suppression device for a gate electrode in accordance with an example embodiment of the present disclosure.
Figure 8:
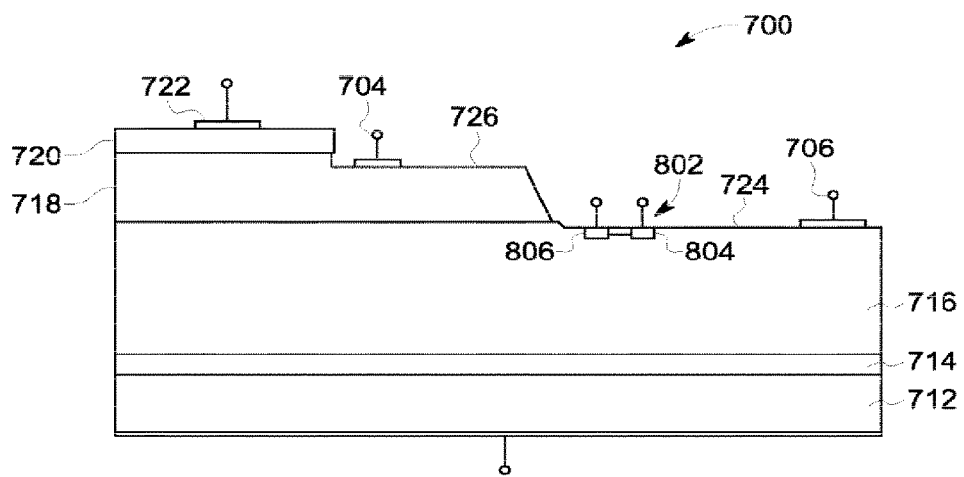
FIG. 8 is a diagram of the cross section of thyristor assembly with monolithically integrated transient voltage suppression protection for a base electrode in accordance with another example embodiment of the present disclosure.

FIG. 7 is a diagram of the cross section of a thyristor assembly 700 with a monolithically integrated transient voltage suppression device 702 for a gate electrode 704 in accordance with an example embodiment of the present disclosure. FIG. 8 is a diagram of the cross section of thyristor assembly 700 with monolithically integrated transient voltage suppression protection for a base electrode 706 in accordance with another example embodiment of the present disclosure. In the example embodiments, thyristor assembly 700 is formed of layers of wide-band gap semiconductor material, such as, but, not limited to SiC. The layers are doped differently with respect to each other to configure different devices and are formed in some cases by epitaxial growth and in other cases by ion implantation. Thyristor assembly 700 includes a cathode layer 712 that in FIG. 7 is formed of N+ semiconductor material, a buffer layer 714 formed of p-type material, and a lower base layer 716 formed of a P− semiconductor material. An upper base layer 718 is formed over at least a portion of lower base layer 716. An anode layer 720 is formed over at least a portion of upper base layer 718. An anode contact 722 is formed over at least a portion of anode layer 720 and a cathode contact 723 is formed over at least a portion of cathode layer 712.

In various embodiments, upper base layer 718 may be formed completely covering lower base layer 716 and then subsequently etched or cut away to expose a portion of a surface 724 of lower base layer 716. Moreover, P layer 720 may be formed completely covering upper base layer 718 and then subsequently etched or cut away to expose a portion of a surface 726 of upper base layer 718.

Figure 9:
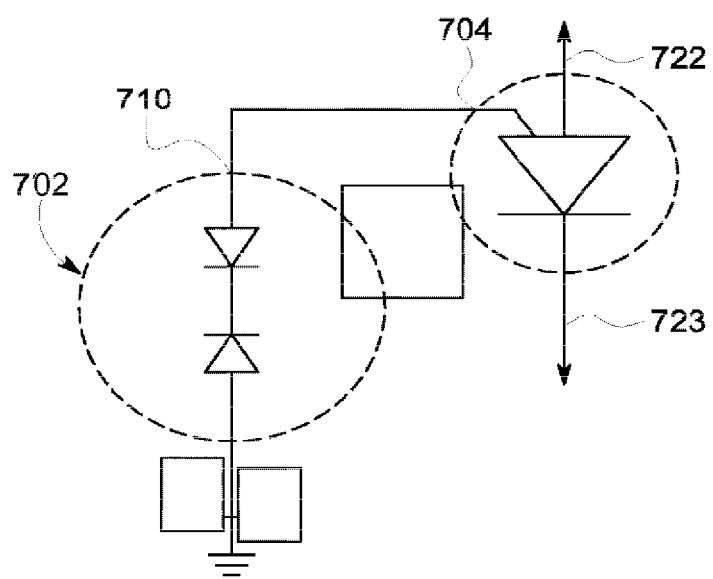
FIG. 9 is a circuit diagram of representing an embodiment of the thyristor assembly shown in FIG. 7.

The transient voltage suppression device 702 is formed in surface 726 illustrated in FIG. 7 and in surface 724 illustrated in FIG. 8. TVS 702 may be formed using, for example, but, not limited to, a mask or by ion implantation. In the embodiment illustrated in FIG. 7, TVS 702 is formed in surface 726 of the N-type semiconductor material of upper base layer 718 of two spaced apart N+ ion implanted regions 730 and 732 and a P+ ion implanted region 734 between the spaced-apart N+ regions. In the embodiment illustrated in FIG. 8, TVS 802 is formed in surface 724 of the P-type semiconductor material of lower base layer 716 of two spaced apart p+ ion implanted regions 804 and 806 and a n+ ion implanted region 808 between the spaced-apart p+ regions. FIG. 9 is a circuit diagram of representing an embodiment of the device shown in FIG. 7. It will be appreciated that the above embodiments that have been described in particular detail are merely example or possible embodiments, and that there are many other combinations, additions, or alternatives that may be included.

The above-described embodiments of a method and system of providing a wide band gap TVS device connected across any of the gate, drain, and source of a wide band gap power device provide a cost-effective and reliable means providing an integrated TVS device to eliminate having to include a discrete TVS device to every device in the circuit, which saves space on the board area. As a result, the methods and systems described herein facilitate protecting power devices from voltage transients in a cost-effective and reliable manner.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A thyristor assembly, comprising:
   a thyristor formed of a wide-band gap semiconductor material, said thyristor comprising:
   a cathode layer formed of N+ semiconductor material;
   a buffer layer made of p-type material formed on the cathode layer;
   a lower base layer made of a P− semiconductor material formed on the buffer layer,
   an upper base layer formed over a portion of the lower base layer;
   an anode layer formed over a portion of the upper base layer;
   a gate electrode formed a portion of the anode layer;
   an anode contact formed a portion of an anode layer; and
   a base electrode formed over a portion of a lower base layer; and
   a transient voltage suppression (TVS) device formed of a wide band gap material, said TVS device formed with the thyristor as a single semiconductor device, said TVS device electrically coupled to said thyristor between the gate electrode and the base electrode.

2. The assembly of claim 1, wherein the thyristor and TVS devices are monolithically integrated.

3. The assembly of claim 1, wherein said TVS device comprises silicon carbide (SiC) formed using ion implantation on a surface of said thyristor.

4. The assembly of claim 1, wherein said thyristor comprises silicon carbide (SiC).

5. The assembly of claim 1, wherein said thyristor and said TVS device are formed of a single semiconductor circuit.

6. The assembly of claim 1, wherein said thyristor and said TVS device are formed of separate circuits on a monolithic semiconductor die and coupled electrically using metallic traces between terminals of said thyristor and said TVS.

7. The assembly of claim 1, wherein said TVS device is formed in the upper base layer.

8. The assembly of claim 1, wherein said TVS device is formed in the lower base layer.

9. The assembly of claim 1, further comprising an anode contact formed over a portion of the anode layer.

10. The assembly of claim 1, further comprising a cathode contact formed over a portion of the cathode layer.

11. The assembly of claim 1, wherein said TVS device including a turn-on voltage selected to be less than a predetermined maximum electrical terminal voltage value.

* * * * *